(12) United States Patent
Zhang et al.

(10) Patent No.: US 9,613,880 B2
(45) Date of Patent: Apr. 4, 2017

(54) SEMICONDUCTOR STRUCTURE AND FABRICATION METHOD THEREOF

(71) Applicant: Semiconductor Manufacturing International (Shanghai) Corporation, Shanghai (CN)

(72) Inventors: Chenglong Zhang, Shanghai (CN); Haiyang Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/958,047

(22) Filed: Dec. 3, 2015

(65) Prior Publication Data

US 2016/0163636 A1    Jun. 9, 2016

(30) Foreign Application Priority Data

Dec. 4, 2014    (CN) .......................... 2014 1 0736226

(51) Int. Cl.
*H01L 21/44*    (2006.01)
*H01L 23/31*    (2006.01)
*H01L 23/522*   (2006.01)
*H01L 21/768*   (2006.01)
*H01L 21/311*   (2006.01)
(Continued)

(52) U.S. Cl.
CPC ...... *H01L 23/3171* (2013.01); *H01L 21/0276* (2013.01); *H01L 21/31144* (2013.01); *H01L 21/76808* (2013.01); *H01L 21/76877* (2013.01); *H01L 23/291* (2013.01); *H01L 23/5226* (2013.01); *H01L 23/5329* (2013.01); *H01L 23/53238* (2013.01); *H01L 23/53276* (2013.01);
(Continued)

(58) Field of Classification Search
CPC ......... H01L 21/76877; H01L 21/31144; H01L 23/5226; H01L 23/53238; H01L 21/0276; H01L 21/76808; H01L 23/291; H01L 23/3171
USPC ........................................................ 438/667
See application file for complete search history.

(56) References Cited

U.S. PATENT DOCUMENTS 6,488,509 B1 * 12/2002 Ho .................. H01L 21/312
                                                      257/E21.259
6,787,446 B2 * 9/2004 Enomoto .......... H01L 21/31116
                                                      257/E21.252

(Continued)

*Primary Examiner* — Luan C Thai
(74) *Attorney, Agent, or Firm* — Anova Law Group, PLLC

(57) ABSTRACT

A method for fabricating a semiconductor structure includes: providing a substrate with a dielectric layer and a passivation layer formed on the substrate; forming a via through the dielectric layer and exposing the substrate; forming a first conductive layer to fill the via with a top surface of the first conductive layer leveled with a top surface of the passivation layer; forming a patterned layer with an opening on the passivation layer. The opening is located above the first conductive layer with a dimension larger than the dimension of the via. The method also includes forming a trench in the dielectric layer; forming a second conductive layer to fill the trench and to electrically connect to the first conductive layer; then removing a portion of the second conductive layer, the patterned layer, and the passivation layer to make a top surface of the second conductive layer level with a top surface of the dielectric layer.

20 Claims, 6 Drawing Sheets

(51) Int. Cl.
*H01L 21/027* (2006.01)
*H01L 23/532* (2006.01)
*H01L 23/29* (2006.01)

(52) U.S. Cl.
CPC *H01L 23/53295* (2013.01); *H01L 2221/1094* (2013.01); *H01L 2924/0002* (2013.01)

(56) References Cited

U.S. PATENT DOCUMENTS

| | | | |
|---|---|---|---|
| 7,799,674 B2 * | 9/2010 | Shinriki | C23C 16/32 257/751 |
| 8,399,772 B2 * | 3/2013 | Gosset | B82Y 10/00 174/250 |
| 8,525,339 B2 * | 9/2013 | Yang | H01L 23/53238 257/750 |

\* cited by examiner

SEMICONDUCTOR STRUCTURE AND FABRICATION METHOD THEREOF

CROSS-REFERENCES TO RELATED APPLICATIONS

This application claims the priority of Chinese patent application No. 201410736226.8, filed on Dec. 4, 2014, the entirety of which is incorporated herein by reference.

FIELD OF THE INVENTION

The present invention generally relates to the field of semiconductor manufacturing technology and, more particularly, relates to a semiconductor structure and the fabricating process thereof.

BACKGROUND

With continuous progress of very-large-scale integration (VLSI) technology, the feature size of semiconductor structure is continuously shrinking, the chip area is persistently getting bigger, and the delay time of interconnect structure is now comparable to the delay time of device gate. People are facing a problem of how to overcome RC (R means resistance while C refers to the capacitance) delay due to the rapid increase of the length of the connections. In particular, the growing influence of the line capacitance between metal wires has resulted in a significant decline in device performance, and thus has become a key constraint to the further development of the semiconductor industry. A number of measures have been adopted to reduce the RC delay caused by interconnections.

Parasitic capacitance and interconnect resistance between interconnect structures cause transmission delay of the signal. Because copper has relatively low resistivity, excellent anti-electromigration characteristics, and high reliability, it can be used to reduce interconnect resistance of metals, thus further reduce the total interconnect delay effect. Therefore, in semiconductor structures, the conventional aluminum interconnect has been replaced by low-resistance copper interconnect. In the meantime, reducing interconnect capacitance may also reduce the delay. Since the parasitic capacitance C is proportional to the relative dielectric constant k of the insulating dielectric material in a circuit layer, using low-k dielectric materials or ultra-low-k dielectric materials as insulating dielectric of different circuit layers to replace the traditional $SiO_2$ dielectric has become a prerequisite to meet with the development of high-speed chip.

However, the performance of semiconductor structures containing interconnect structures formed by the current technology still needs to be further improved. The disclosed semiconductor structure and fabricating process are directed to solve one or more problems set forth above and other problems.

BRIEF SUMMARY OF THE DISCLOSURE

One aspect of the present disclosure provides a method for fabricating a semiconductor structure. Specifically, the method includes providing a semiconductor substrate with a dielectric layer formed on the substrate and a passivation layer formed on the dielectric layer; forming a via running through the dielectric layer and exposing the substrate by etching the passivation layer and the dielectric layer; forming a first conductive layer to fill the via with a top surface of the first conductive layer leveled with a top surface of the passivation layer; and then forming a patterned layer with an opening on the passivation layer. The opening is located above the first conductive layer and a dimension of the opening is larger than a dimension of the via. The method also includes forming a trench in the dielectric layer by etching a portion of the dielectric layer along the opening using the patterned layer as a mask; then forming a second conductive layer to fill the trench. The second conductive layer is electrically connected with the first conductive layer. Finally, the method includes removing a portion of the second conductive layer exceeding a height of the dielectric layer, the patterned layer, and the passivation layer to make a top surface of the second conductive layer level with a top surface of the dielectric layer.

Another aspect of the present disclosure also includes a semiconductor structure. The semiconductor structure includes a substrate with a dielectric layer formed on a surface of the substrate, a first conductive layer occupying a via formed in the dielectric layer, and a second conductive layer occupying a trench formed on a top of the first conductive layer and in the dielectric layer. The trench is formed above the via and the dimension of the trench is larger than the dimension of the via. The first conductive layer is in contact with the substrate on bottom of the via. The second conductive layer is electrically connected to the first conductive layer and the top surface of the second conductive layer is leveled with the top surface of the dielectric layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
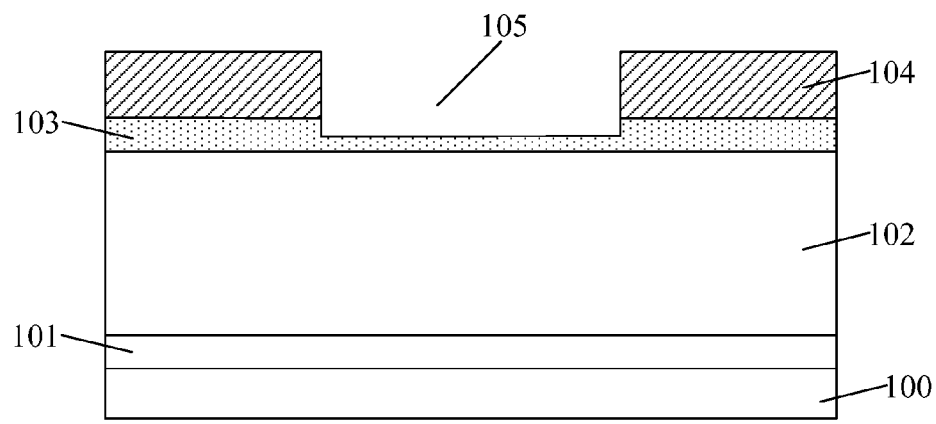
FIG. 1-4 illustrate schematic cross-section views of semiconductor structures of a current fabrication process.

As described above in the background section, the electric performance of semiconductor structures fabricated by using the current technology may be poor. As an example, a detailed description of a fabrication process using a via first trench last (VFTL) method will be given to illustrate the limitation of semiconductor structures fabricated using the current technology. The specific fabrication process using the VFTL method to form a semiconductor structure includes the following technical steps:

As shown in FIG. 1, a substrate 100 is provided. The substrate 100 has an etching stop layer 101 on the top surface of the substrate 100, a dielectric layer 102 formed on the surface of the etching stop layer 101, a passivation layer 103 formed on the surface of the dielectric layer 102, and a hard mask layer 104 with a trench 105 formed on the surface of the passivation layer 103. The trench 105 formed in the hard mask layer 104 defines both the position and the dimension of a subsequently-formed groove.

The dielectric layer 102 is made of either a low-k dielectric material or an ultra-low-k dielectric material to reduce the RC delay effect in the semiconductor structure.

Figure 2:
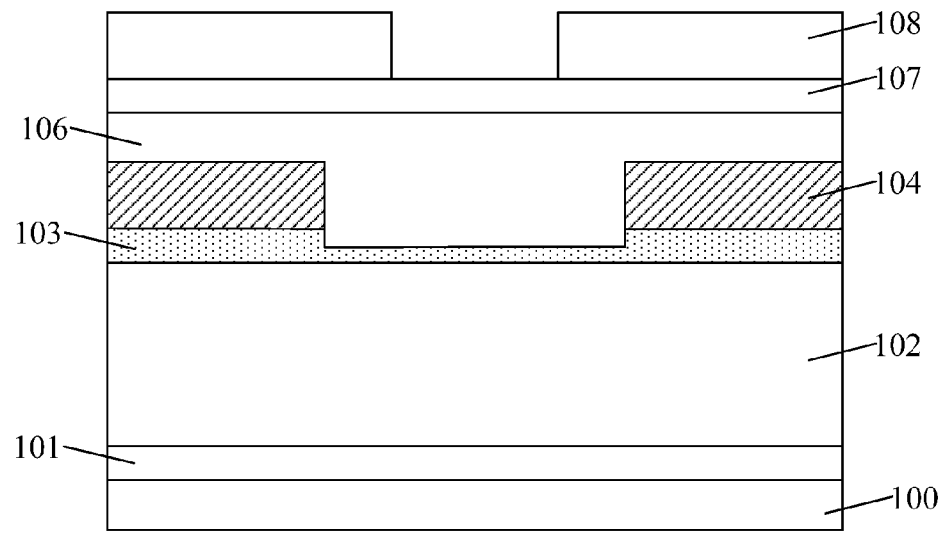

Further, as shown in FIG. 2, an organic distribution layer 106 may be formed to cover the surface of the hard mask layer 104 and the passivation layer 103. Then, a bottom anti-reflective coating 107 is formed on the surface of the organic distribution layer 106 and a patterned photoresist layer 108 may be formed on the surface of the bottom anti-reflective coating 107. The patterned photoresist layer 108 defines the position and the dimension of a subsequently-formed via.

Because the trench 105 in the hard mask layer 104 exposes the surface of the passivation layer 103, when the bottom anti-reflective coating 107 is directly formed on the surface of the hard mask layer 104 and the surface of the passivation layer 103, the top surface of the bottom anti-reflective coating 107 may not be uniform. The top surface of the bottom anti-reflective coating 107 located above the trench 105 is defined as a first top surface while the top surface of the bottom anti-reflective coating 107 located above the hard mask layer 104 is defined as a second top surface.

The position of the first top surface may be lower than the position of the second top surface. When a patterned photoresist layer 108 is further formed on the non-uniform top surface of the bottom anti-reflective coating 107, the exposure process in the photolithography technique may be adversely affected, resulting in poor morphology of the patterned photoresist layer 108. Similarly, when a patterned photoresist layer 108 is directly formed on the surface of the hard mask layer 104 and the surface of the passivation layer 103, because of the presence of the trench 105, the morphology of the patterned photoresist layer 108 may also be poor.

In view of the above problems, the organic distribution layer 106 is then formed prior to the formation of the anti-reflective coating 107. The organic distribution layer 106 has desired characteristics in filling holes, thus the height of the top surface of the organic distribution layer 106 may be formed uniformly. Therefore, the presence of the organic distribution layer 106 may help forming a patterned photoresist layer 108 with good morphology.

Figure 3:
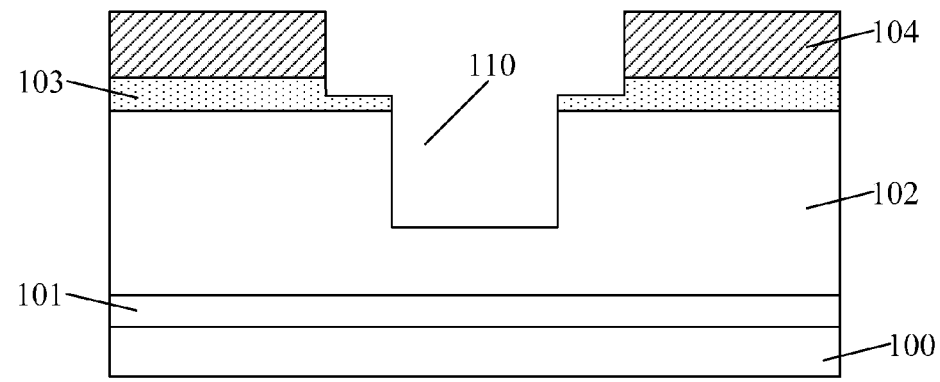

Further, as shown in FIG. 3, after forming the patterned photoresist layer, an initial via 110 is formed in the dielectric layer 102 by etching the bottom organic anti-reflective coating 107, the organic distribution layer 106, the passivation layer 10, and a portion of the thickness of the dielectric layer 102 using the patterned photoresist layer 108 as a mask. During the etching process, the patterned photoresist layer 108 and the bottom anti-reflective coating 107 are removed. Further, the organic distribution layer 106 is removed.

The etching process may also consume a portion of the thickness of the organic distribution layer 106. However, after the formation of the initial via 110, the surface of the hard mask layer 104 and the surface of the passivation layer 103 may still be covered by another portion of the thickness of the organic distribution layer 106.

The organic distribution layer 106 is usually removed by a dry etching, an ashing, or a wet etching method. However, the dielectric layer 102 is made of a low-k dielectric material or an ultra-low-k dielectric material, thus the dielectric layer 102 usually has a porous structure and contains relatively more methyl groups. In addition, the organic distribution layer 106 is usually made of organic polymeric materials so that the process to remove the organic distribution layer 106 may cause damage to the dielectric layer 102 and further affects the electric performance of the semiconductor structure. For instance, the reliability of the semiconductor structure may become worse and the delay effect may become more pronounced.

Figure 4:
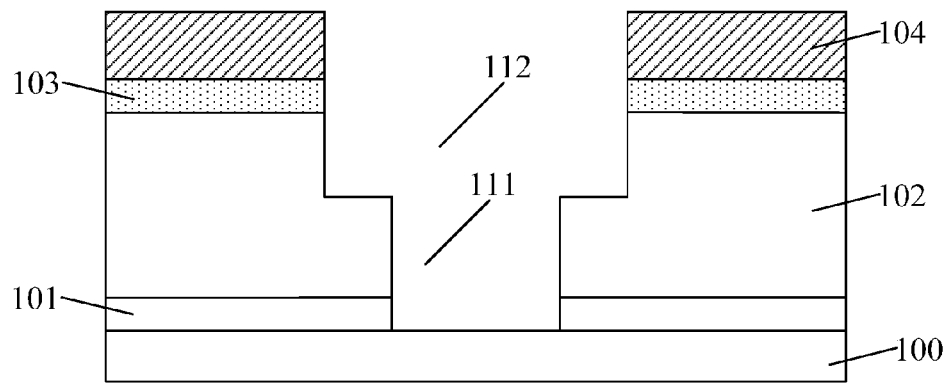

As shown in FIG. 4, after the removal of the organic distribution layer 106, the dielectric layer 102 may be further etched by using the hard mask layer 104 as a mask until the surface of the substrate 100 is exposed. A via and a trench may then be formed with the via and the trench interpenetrating with each other.

Further, when using a trench first via last method, the above-mentioned damage to the dielectric layer during a process to remove the organic distribution layer may still exist.

Based on the above analysis, in a case where the patterned photoresist layer and the bottom anti-reflective coating can be completely removed during etching the dielectric layer, and the dielectric layer is not exposed to the environment to remove the organic distribution layer, damage to the dielectric layer may be efficiently avoided and the electric performance of the semiconductor structure may be improved.

Accordingly, such problem may be solved by forming a uniform surface for the formation of the photoresist layer without introducing an organic distribution layer. Specifically, prior to the formation of the patterned photoresist layer, when the surface for forming and patterning the photoresist layer has a uniform height, the organic distribution layer is no longer required, and as a result, exposure of the dielectric layer during the removal of the organic distribution layer may be avoided.

The present disclosure provides a method for fabricating a semiconductor structure. Specifically, the method includes providing a substrate with a dielectric layer formed on the surface of the substrate; forming a via through the dielectric layer to expose the surface of the substrate; then forming a first conductive layer to fill up the via. The top surface of the first conductive layer is leveled with the top surface of the passivation layer, thus the surface of the first conductive layer and the passivation layer does not adversely affect the uniformity of the exposure. Therefore, introducing an extra organic distribution layer with a uniform height of the top surface in the current technology is no longer required so that damage to the dielectric layer due to removing the organic distribution layer in the prior art is avoided. The method further includes forming a patterned layer on the surface of the passivation layer with an opening formed in the patterned layer; then forming a trench in the dielectric layer by etching the dielectric layer along the opening using the patterned layer as a mask; further, forming a second conductive layer to fill the trench. The second conductive layer is electrically connected to the first conductive layer.

Further, the disclosed fabrication method does not include forming any organic distribution layer, thus damage to the dielectric layer due to the removal of the organic distribution layer in the current technology is avoided. Therefore, the disclosed method may ensure desired performance of the dielectric layer, optimize the electric properties of the semiconductor structure, improve the reliability of the semiconductor structure, and suppress the RC delay problem.

An exemplary fabrication method consistent with the present disclosure will now be described in detail to illustrate the goal, the feature, and the advantage of the method of the present disclosure.

Figure 13:
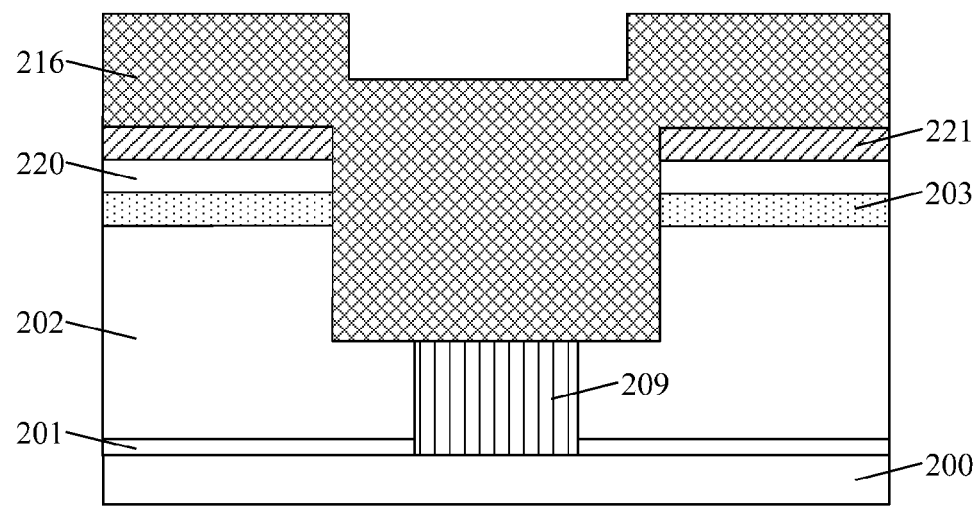
Figure 14:
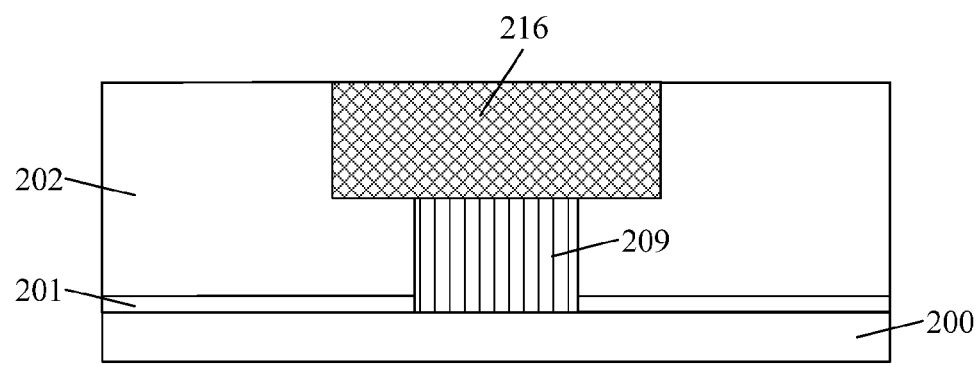
Figure 15:
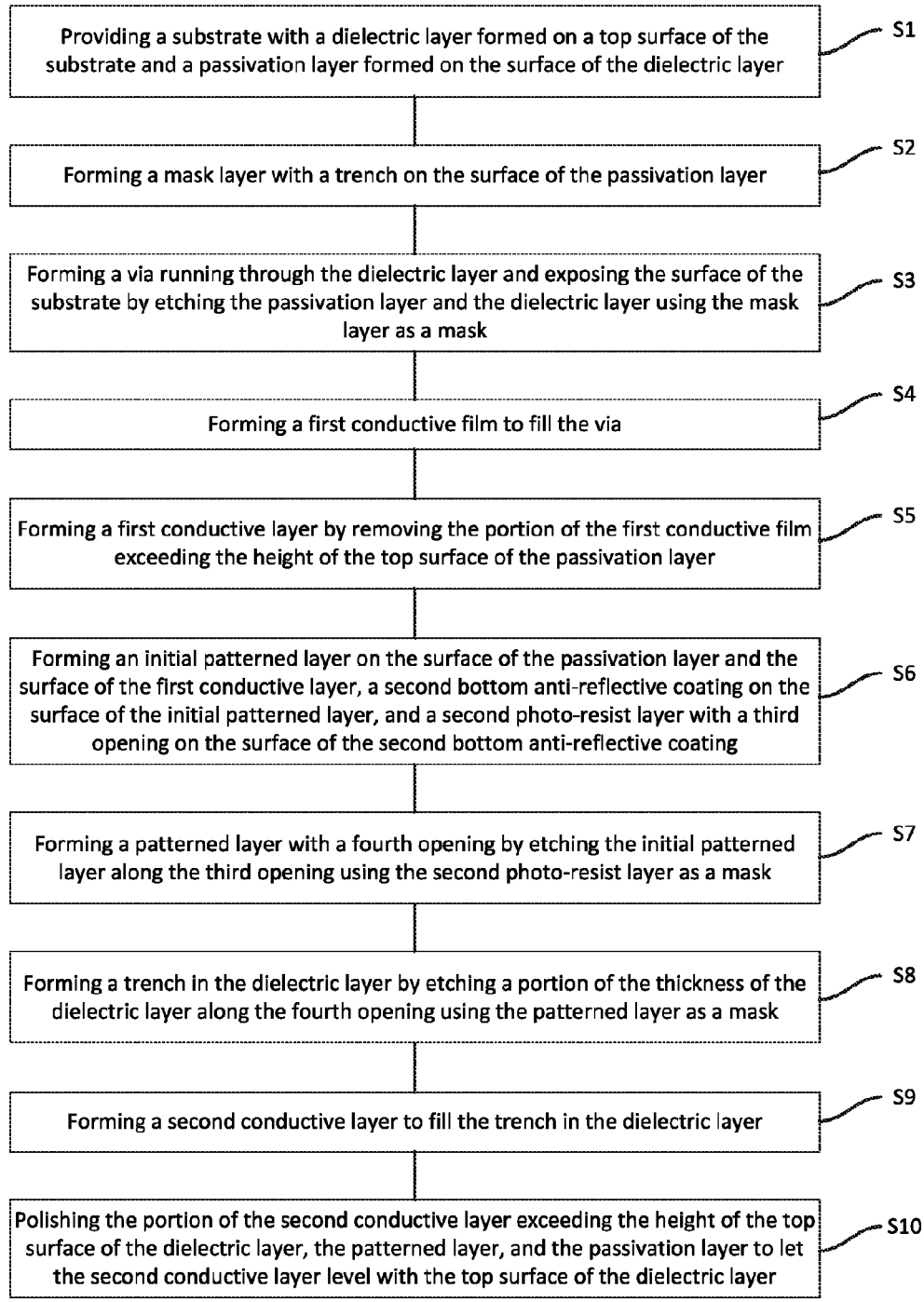
FIG. 15 illustrates a flowchart for an exemplary fabrication process of a semiconductor structure consistent with the disclosed embodiments.

FIG. 15 illustrates a flowchart for the fabrication process of a semiconductor structure in one embodiment of the present disclosure. FIGS. 5-14 shows schematic cross-section views of semiconductor structures corresponding to certain stages of the fabrication process shown in FIG. 15.

Figure 5:
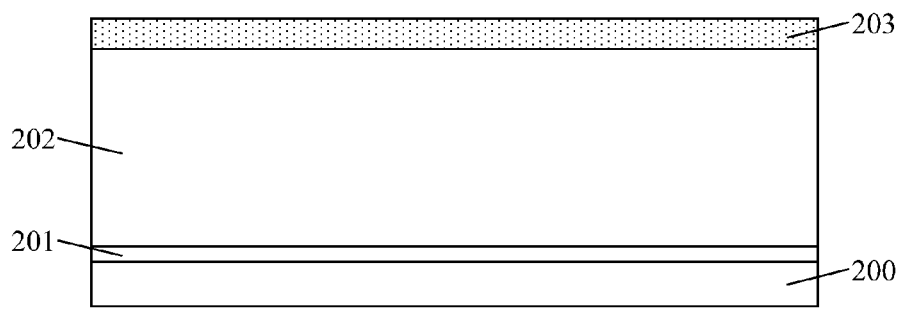
FIGS. 5-14 illustrate schematic cross-section views of semiconductor structures corresponding to certain stages of an exemplary fabrication process consistent with the disclosed embodiments.

At the beginning of the fabrication process, a substrate is provided (S1). FIG. 5 shows a schematic cross-section view of the substrate 200. As shown in FIG. 5, after the substrate 200 is provided, a dielectric layer 202 may be formed on a top surface of the substrate 200, and a passivation layer 203 may be formed on the surface of the dielectric layer 202.

The substrate 200 may be made of one or more of single crystalline Si, polycrystalline Si, amorphous Si, silicon germanium compound, silicon on insulator (SOI), Ge, SiGe, GaAs, etc. In one embodiment, the substrate 200 is made of Si.

A bottom metallic layer (not shown) may be formed in the substrate 200. The bottom metallic layer is used to form electric connections with a subsequently formed first conductive layer and second conductive layer. Semiconductor devices, such as NMOS transistor, PMOS transistor, CMOS transistor, resistor, capacitor, inductor, etc., may also be pre-formed in the substrate 200.

In one embodiment, an etching stop layer 201 may also be formed between the substrate 200 and the dielectric layer 202.

The function of the etching stop layer 201 is: on one hand, after forming the dielectric layer 202 in a subsequent process, the etching rate of the etching stop layer 201 is far below the etching rate of the dielectric layer 202, therefore the etching stop layer 201 plays a role in stopping etching, preventing the substrate 200 from being etched; on the other hand, the etching stop layer 201 may also prevent the metal ions in the bottom metallic layer from diffusing into the dielectric layer 202.

The etching stop layer 201 may be made of one or more of silicon nitride (SiN), nitride doped carbon (NDC), carbon doped silicon nitride, carbon doped silicon oxynitride (SiON), etc. A material with a relatively small dielectric constant may be used to form the etching stop layer 201 in order to reduce the relative dielectric constant of the semiconductor structure and decrease the RC delay of the semiconductor structure.

In one embodiment, the etching stop layer 201 is made of carbon doped SiN and the thickness of the etching stop layer is in a range of 100~500 Angstroms.

The dielectric layer 202 may be made of $SiO_2$, a low-k dielectric material (refer to dielectric materials with a relative dielectric constant greater or equal to 2.5 but smaller than 3.9), or an ultralow-k dielectric material (refers to dielectric materials with a relative dielectric constant smaller than 2.5). Using a low-k dielectric material or an ultralow-k dielectric material to form the dielectric layer 202 may efficiently reduce the RC delay in the semiconductor structure.

The low-k dielectric material may include SiCOH, fluorosilicate glass (FSG), boron silicate glass (BSG), phosphor silicate glass (PSG), boron-phosphor silicate glass (BPSG), etc.

The ultralow-k dielectric material may include SiOH, porous methyl-silsesquioxane (MSQ, $(CH_3SiO_{3/2})_n$) dielectric material, porous hydrogen-silsesquioxane (HSQ, $(HSiO_{3/2})_n$) dielectric material, black diamond (BD), etc.

In one embodiment, the dielectric layer 202 is made of an ultralow-k dielectric material. The ultralow-k dielectric material is black diamond. The dielectric layer 202 may be formed by a chemical vapor deposition or a spin-coating process.

The passivation layer 203 is used as a transition layer between the dielectric layer 202 and a mask layer formed in a subsequent process. The passivation layer 203 may prevent deformation of the dielectric layer 202 due to a large lattice constant mismatch between the material of the dielectric layer 202 and the material of the mask layer. In the meantime, the passivation layer 203 may also protect the dielectric layer 202. The passivation layer 203 may be made of SiO or carbon-contained SiO.

In one embodiment, the passivation layer 203 is formed by using tetraethoxysilane (TEOS, $Si(OC_2H_5)_4$)) as a reactive material. The thickness of the passivation layer 203 is in a range of 50~100 Angstroms.

Figure 6:
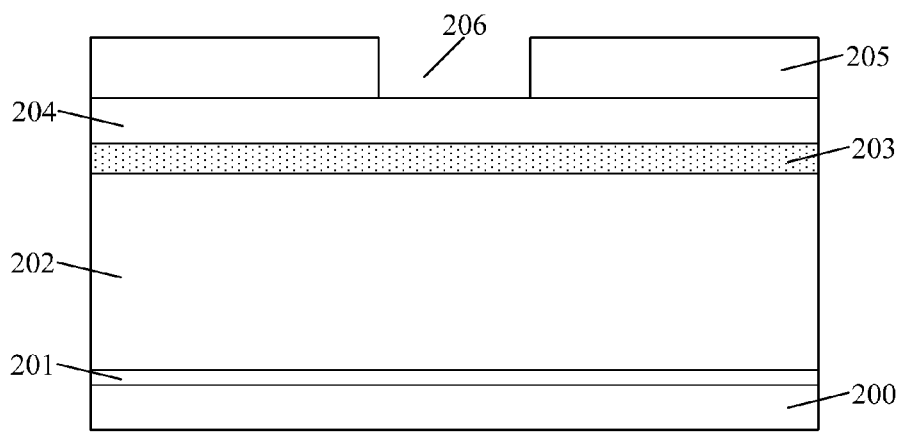

Further, a mask layer with a trench 206 may be formed on the surface of the passivation layer 203 (S2). FIG. 6 shows a schematic cross-section view of the structure. As shown in FIG. 6, the mask layer includes: a first bottom anti-reflective coating layer 204 covering the surface of the passivation layer 203 and a first photo-resist layer 205 formed on the surface of the first bottom anti-reflective coating 204. A trench 206 is formed in the first photo-resist layer 205 to expose the surface of the first bottom anti-reflective coating 204.

Further, the position and the width dimension of the trench 206 defines the position and the width dimension of a subsequently-formed via. Because the height of the top surface of the passivation layer 203 is uniform, the organic distribution layer formed between the passivation layer 203 and the first bottom anti-reflective coating 204 in the current technology is not required. Therefore, the subsequent process to remove such an organic distribution layer is avoided and exposure of the dielectric layer 202 in an environment to remove such an organic distribution layer is also prevented.

The first photo-resist layer 205 with the trench 206 may be formed by coating a photo-resist film onto the surface of the first bottom anti-reflective coating 204, and then performing an exposure process and a development process. Because the first bottom anti-reflective coating 204 is formed under the photo-resist film, the exposure on the photo-resist film may be uniform so that the morphology and the position accuracy of the formed first photo-resist layer 205 may be improved.

The first bottom anti-reflective coating 204 may be made of inorganic anti-reflective materials or organic anti-reflective materials. In one embodiment, the first bottom anti-reflective coating 204 is made of Si-containing organic anti-reflective material. That is, the first bottom anti-reflective coating 204 is a Si-containing bottom anti-reflective coating (Si-BARC).

In other embodiments, the mask layer may only include a first photo-resist layer with a trench formed in the first photo-resist layer and exposing the surface of the passivation layer. Alternatively, the mask layer may include a first bottom anti-reflective coating, a first photo-resist layer formed on the surface of the first bottom anti-reflective coating, a first top anti-reflective coating formed on the surface of the first photo-resist layer, and a trench formed all the way through the first photo-resist layer and the first top anti-reflective coating.

During a subsequent process to form a via in the dielectric layer 202 through an etching process, an etching gas containing fluorine gas is usually used. When the mask layer is made of a photo-resist material and a bottom anti-reflective material, the fluorine gas may also etch the mask layer. Therefore, during the etching process, the mask layer may be removed with the formation of the via, thus damage to the dielectric layer 202 during an extra process to remove the mask layer may be avoided.

In other embodiments, the mask layer may also be made of one or more of SiN, SiON, TiN, TaN, etc. The trench in the mask layer exposes a portion of the surface of the passivation layer. The mask layer may be formed through a process including: forming an initial patterned layer to cover the passivation layer; then, forming a patterned photo-resist layer on the surface of the initial patterned layer; and finally, forming a mask layer with a trench to cover the surface of the passivation layer by etching the initial patterned layer using the patterned photo-resist layer as a mask.

Figure 7:
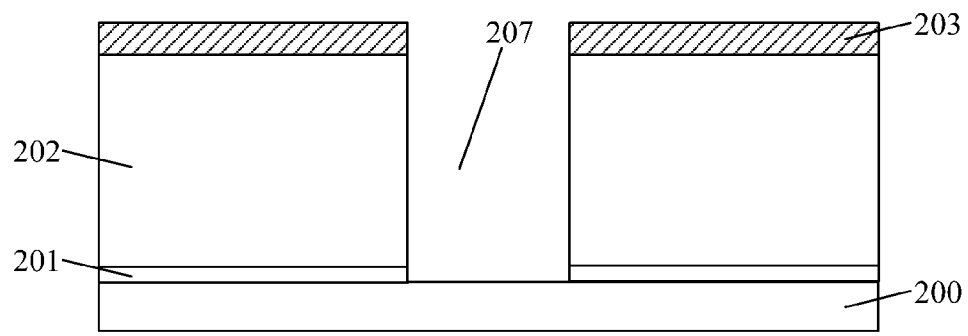

Further, a via 207 running through the dielectric layer 202 and exposing the surface of the substrate 200 may be formed by etching the passivation layer 203 and the dielectric layer 202 (S3). FIG. 7 shows a schematic cross-section view of the corresponding semiconductor structure.

Specifically, as shown in FIG. 7, the first bottom anti-reflective coating 204 (referring to FIG. 6), the passivation layer 203, the dielectric layer 202, and the etching stop layer 201 may be etched along the trench 206 using the first photo-resist layer 205 (referring to FIG. 6) as a mask until the surface of the substrate 200 is exposed, thus a via 207 may be formed through both the dielectric layer 202 and the etching stop layer 201.

The via 207 may be formed by a dry etching process. The etching gas of the dry etching process may include $CF_4$, $CHF_3$, $CH_2F_2$, $CH_3F$, $C_4F_8$, $C_5F_8$, etc.

Because the etching gas includes a fluorine-containing gas, the etching rates of the photo-resist material and the bottom anti-reflective material are also relatively high, during the formation of the via, the mask layer may also be removed. Therefore, without introducing an extra process to remove the mask layer, the disclosed method further avoids damage to the dielectric layer 202 during the extra process to remove the mask layer.

In certain other embodiments, the mask layer may be removed by an additional etching process performed after the etching process to form the via.

Figure 8:
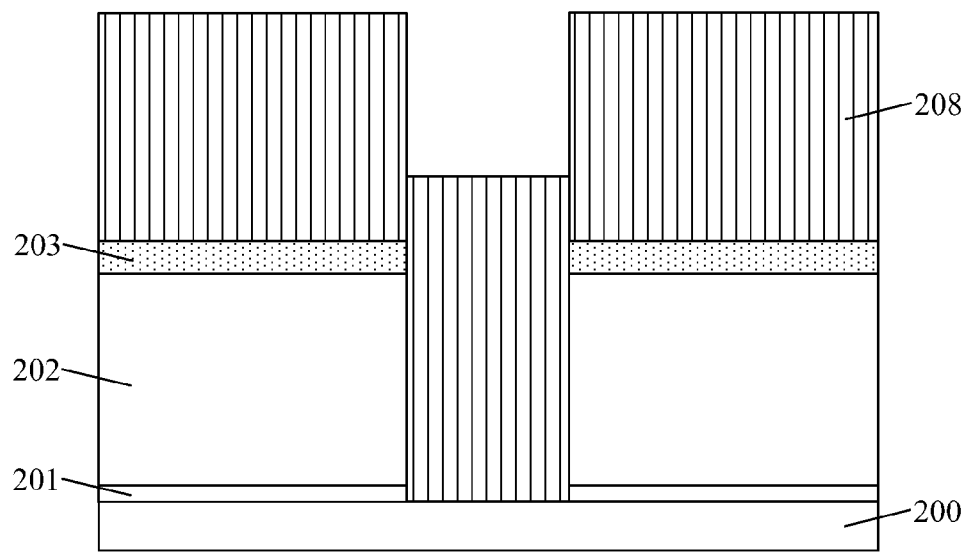

Further, a first conductive film may be formed (S4). FIG. 8 shows a cross-section view of the corresponding semiconductor structure after the formation of the first conductive film. As shown in FIG. 8, a first conductive film 208 is formed by filling up the via 207 (referring to FIG. 7). The first conductive film 208 also covers the surface of the passivation layer 203.

The first conductive film 208 is used to subsequently form a first conductive layer by removing the portion of the first conductive film 208 formed on the surface of the passivation layer 203. The first conductive layer may occupy the space in the via 207 and the top of the first conductive layer may be leveled with the top of the passivation layer 203. In one embodiment, the first conductive film 208 is made of conductive carbon nanotubes.

Conductive carbon nanotubes have high modulus, high strength, good heat transfer property, and good electrical conductivity and, thus, using conductive carbon nanotubes as the material to form the first conductive film 208 may be conducive to improving the electrical properties of the semiconductor structure. In addition, because the metal ions in the conductive carbon nanotubes may unlikely diffuse into the dielectric layer 202, forming an extra barrier layer between the first conductive film 208 and the dielectric layer 202 may not be required. Therefore, the use of conductive carbon nanotubes as the material to form the first conductive film 208 may help to decrease the resistivity of the semiconductor structure, thus further decrease the RC delay effect.

In the meantime, during a subsequent process to etch the dielectric layer 202, the etching rate of the material of the dielectric layer 202 in the etching process may be relatively close to the etching rate of the conductive carbon nanotubes. Therefore, a portion of the thickness of the first conductive layer may be simultaneously etched during the formation of the dielectric layer 202, so that a process window to subsequently form a second conductive layer may be increased while the filling outcome of the second conductive layer may be improved.

Before the formation of the first conductive film 208, a metallic catalyst layer may be formed on the bottom of the via 207. The metallic catalyst layer may be made of Fe, Co, Ni, or Ti. In one embodiment, during the formation of the metallic catalyst layer on the bottom of the via 207, the metallic catalyst layer is also formed on the surface of the passivation layer 203.

The first conductive film 208 may be formed by any appropriate method such as arc discharge, laser ablation, chemical vapor deposition, solid-phase pyrolysis, glow generating method, gas combustion, polymer reaction synthesis, etc.

Figure 9:
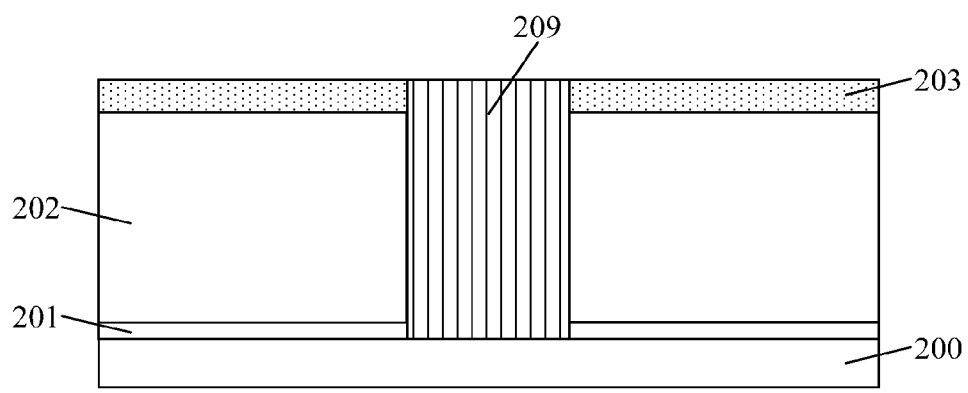

Further, a first conductive layer may be formed from the first conductive film (S5). FIG. 9 shows a schematic cross-section view of the corresponding semiconductor structure. As shown in FIG. 9, a first conductive layer 209 is formed by removing the portion of the first conductive film 208 (referring to FIG. 8) exceeding the height of the top surface of the passivation layer 203. The top surface of the first conductive layer 209 is leveled with the top surface of the passivation layer 203.

A chemical mechanical polishing (CMP) process may be performed to remove the portion of the first conductive film 208 formed on the surface of the passivation layer 203. The top surface of the passivation layer 203 serves as a stop point for the chemical mechanical polishing process. In certain other embodiments, the first conductive layer may also be made of Cu, Al, or W.

Figure 10:
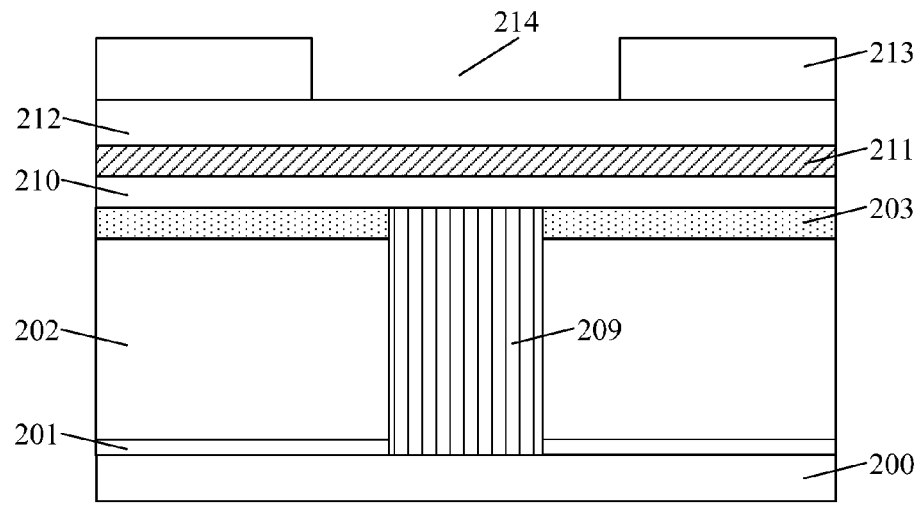

Further, an initial patterned layer may be formed (S6). FIG. 10 shows a schematic view of the corresponding semiconductor structure. As shown in FIG. 10, an initial patterned layer may be formed to cover the surface of the passivation layer 203 and the surface of the first conductive layer 209. Further, a second bottom anti-reflective coating 212 may be formed to cover the initial patterned layer, and a second photo-resist layer 213 may be formed on the second bottom anti-reflective coating 212 with a third opening 214 to expose a portion of the surface of the second bottom anti-reflective coating 212.

The initial patterned layer may provide a basis for a subsequently-formed patterned layer with a fourth opening. The position and the dimension of the third opening define the position and the dimension of the subsequently-formed fourth opening.

In one embodiment, the third opening 214 is located above the first conductive layer 209 and the dimension of the third opening 214 is larger than the dimension of the trench 206 (referring to FIG. 6).

The patterned layer to be formed in a subsequent process may be a hard mask layer. The initial patterned layer may be made of SiN, SiON, TiN, or TaN. The patterned layer to be formed may have a double-layer structure. The initial patterned layer may include a first initial hard mask layer 210 formed on the surface of the passivation layer 203 and a second initial hard mask layer 211 formed on the surface of the first initial hard mask layer 210. The first initial hard mask layer 210 may be made of TaN. The second initial hard mask layer 211 may be made of TiN. After a subsequent etching process, the first initial hard mask layer 210 may form a first hard mask layer while the second initial hard mask layer 211 may form a second hard mask layer.

In certain other embodiments, a second photo-resist layer with a third opening may be directly formed on the surface of the initial patterned layer.

Figure 11:
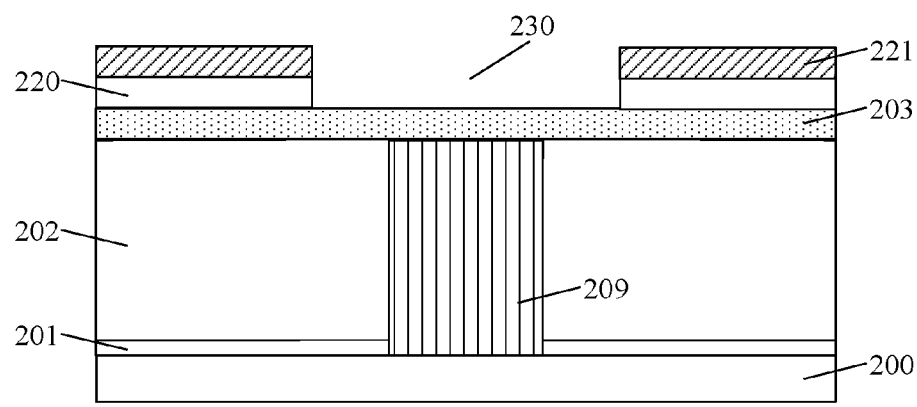

Further, a patterned layer with a fourth opening may be formed (S7). FIG. 11 shows a schematic cross-section view of the corresponding semiconductor structure after the formation of the patterned layer. As shown in FIG. 11, a patterned layer with a fourth opening 230 may be formed by etching the initial patterned layer along the third opening 214 (referring to FIG. 10) using the second photo-resist layer 213 (referring to FIG. 10) as a mask.

Because a subsequently formed second conductive layer needs to be electrically connected to the first conductive layer 209 while the dimension of a subsequently formed trench needs to be larger than the dimension of the via (referring to FIG. 7), the fourth opening 230 may be formed above the first conductive layer 209 and the dimension of the fourth opening 230 may be larger than the dimension of the via 207.

Specifically, the patterned layer with the opening 203 may be formed on the surface of the passivation layer 203 by etching the second bottom anti-reflective coating 212 and the initial patterned layer. The fourth opening 230 is formed above the first conductive layer 209 with a dimension larger than the dimension of the via 207.

In one embodiment, the patterned layer is a hard mask layer. Referring to FIG. 11, the fourth opening 230 exposes the surface of the first conductive layer 209 and a portion of the surface of the passivation layer 203. The patterned layer is made of one or more of SiN, SiON, TiN, TaN, etc.

In one embodiment, referring to FIG. 11, the patterned layer includes a first hard mask layer 220 formed on the surface of the passivation layer 203 and a second hard mask layer 221 formed on the surface of the first hard mask layer 220. The first initial hard mask layer 210 is made of TaN. The second initial hard mask layer 211 is made of TiN. Such specific structure may further improve the morphology of a trench formed in a subsequent process.

During the etching process to form the patterned layer, the second photo-resist layer 213 (referring to FIG. 10) and the second bottom anti-reflective coating 212 (referring to FIG. 10) are also removed. In certain other embodiments, a portion of the thickness of the second photo-resist layer 213 and the second bottom anti-reflective coating 212 may remain on the surface of the patterned layer after the etching process to form the patterned layer. However, during a subsequent process to form a trench by etching the dielectric layer 202, the second photo-resist layer 213 and the second bottom anti-reflective coating 212 may still be completely removed. Therefore, damage to the dielectric layer 202 during an extra process to remove the second photo-resist layer 213 and the second bottom anti-reflective coating 212 may be avoided.

In certain other embodiments, the patterned layer may be made of a photo-resist material and may also include a bottom anti-reflective material or a top anti-reflective material.

Figure 12:
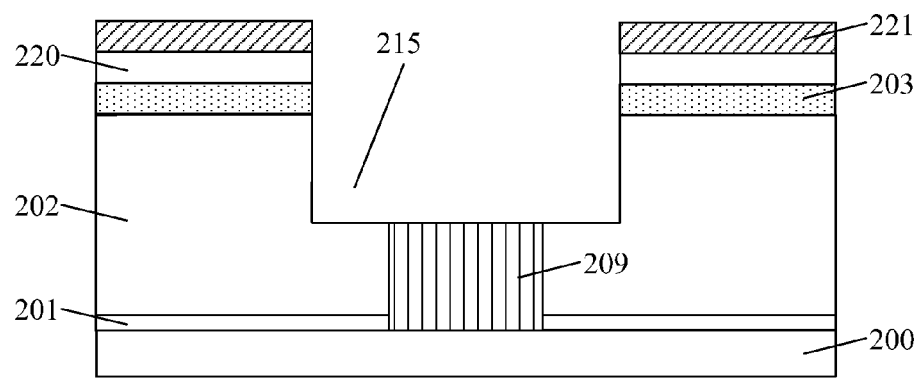

Further, a trench may be formed in the dielectric layer (S8). FIG. 12 shows a cross-section view of the corresponding semiconductor structure. As shown in FIG. 12, a trench 215 may be formed in the dielectric layer 202 by etching a portion of the thickness of the dielectric layer 202 along the fourth opening 230 (referring to FIG. 11) using the patterned layer as a mask.

The trench 215 may be formed by a dry etching process. The etching gas used in the etching process to form the trench may include $CF_4$, $CHF_3$, $CH_2F_2$, $CH_3F$, $C_4F_8$, $C_5F_8$, etc.

During the process to form the trench 215 by etching the dielectric layer 202, a portion of the first conductive layer 209 may be etched so that a process window to subsequently form a second conductive layer may be increased and the filling outcome of the second conductive layer may also be improved. During the formation of the second conductive layer by filling up the trench 215, the second conductive layer may cover the etched top surface of the first conductive layer 209, thus realizing electrical connections between the second conductive layer and the first conductive layer 209.

In one embodiment, the first conductive layer 209 is made of carbon nanotubes. Therefore, the etching rate of the first conductive layer 209 and the etching rate of the dielectric layer 202 are nearly the same, thus the bottom of the trench 215 may be leveled with the etched top surface of the first conductive layer 209.

In certain other embodiments, when the etching rate of the first conductive layer 209 is lower than the etching rate of the dielectric layer, the etched thickness of the first conductive layer 209 may be smaller than the etched thickness of the dielectric layer. When the etching rate of the first conductive layer 209 is higher than the etching rate of the dielectric layer, the etched thickness of the first conductive layer 209 may be larger than the etched thickness of the dielectric layer. When the etching rate of the first conductive layer 209 equals to the etching rate of the dielectric layer, the etched thickness of the first conductive layer 209 may be the same as the etched thickness of the dielectric layer.

Further, a second conductive layer may be formed (S9). FIG. 13 shows a cross-section view of the corresponding semiconductor structure after forming the second conductive layer. As shown in FIG. 13, a second conductive layer 216 may be formed to fill up the trench 215 (referring to FIG. 12).

Referring to FIG. 13, the second conductive layer 216 is electrically connected to the first conductive layer 209 and the second conductive layer 216 may cover the top surface of the first conductive layer 209 and the surface of the patterned layer.

The second conductive layer 216 may have a single-layer structure or a multi-layer structure. When the second conductive layer 216 has a single-layer structure, the second conductive layer 216 may include a metallic layer filling up the trench 215 and may cover the surface of the hard mask layer and the first conductive layer 209.

In one embodiment, the second conductive layer 216 has a multi-layer structure. The second conductive layer 216 includes a barrier layer formed on the side surface of the trench 215 and a metallic layer formed on the surface of the barrier layer. The barrier layer may also cover the bottom surface of the trench 215 and the top surface and the side surface of the first conductive layer 209.

The barrier layer may prevent contamination due to diffusion of metal ions in the metallic layer to the substrate 200 or the dielectric layer 202, thus improving the properties of the semiconductor structure. In addition, the barrier layer may provide a desired interface condition for the formation of the metallic layer, thus the formed metallic layer may have relatively strong adhesion with the barrier layer.

The barrier layer may be made of one or more of Ti, Ta, W, TiN, TaN, TiSiN, TaSiN, WN, WC, etc. The barrier layer may have a single-layer structure or a multiple-layer structure. The barrier layer may be formed by a chemical vapor deposition, a physical vapor deposition, or an atomic layer deposition process.

In one embodiment, the barrier layer is made of Ta and the thickness of the barrier layer is in a range of 10~500 Angstroms. The barrier layer is made by a physical vapor deposition process.

The metallic layer may be made of Cu, Al, or W. The metallic layer may be made by a physical vapor deposition or an electroplating process. In one embodiment, the metallic layer is made of Cu and by an electroplating process.

Further, the second conductive layer is polished (S10). FIG. 14 shows a schematic cross-section view of the corresponding semiconductor structure. As shown in FIG. 14, the portion of the second conductive layer 216 exceeding the height of the top surface of the dielectric layer 202, the patterned layer, and the passivation layer 203 (referring to FIG. 13) may be removed to let the second conductive layer 216 level with the top surface of the dielectric layer 202.

In one embodiment, the portion of the second conductive layer 216 exceeding the height of the top surface of the dielectric layer 202, the patterned layer (referring to FIG. 13), and the passivation layer 203 (referring to FIG. 13) are removed by a chemical mechanical polishing process. A portion of the thickness of the dielectric layer 202 may also be removed during the polishing process to let the top surface of the second conductive layer 216 level with the top surface of the dielectric layer 202.

The present disclosure provides a new method for fabricating semiconductor structures. Specifically, according to the disclosed method, after forming a via through a dielectric layer to expose the surface of the substrate, a first conductive layer is formed to fill the via and the top surface of the first conductive layer is leveled with the top surface of the passivation layer. A patterned layer with an opening is then formed on the surface of the passivation layer. The opening is formed above the first conductive layer with a dimension larger than the dimension of the via. A trench is subsequently formed by etching the dielectric layer using the patterned layer as a mask. Further, a second conductive layer is formed by filling the trench and the second conductive layer is electrically connected to the first conductive layer. Finally, the portion of the second conductive layer exceeding the top surface of the dielectric layer, the patterned layer, and the passivation layer may be removed to let the second conductive layer leveled with the surface of dielectric layer.

Compared to methods in the current technology, the disclosed method may demonstrate several advantages:

First, because the top surface of the first conductive layer is leveled with the top surface of the passivation layer while the height of the interface under the patterned layer is uniform, the organic distribution layer frequently formed between the first conductive layer and the patterned layer on the top of the passivation layer in the current technology is not required. Therefore, the disclosed method may avoid damage to the dielectric layer during the subsequent removal of such an organic distribution layer, thus the dielectric layer may retain desired properties after the formation of the first conductive layer and the second conductive layer, as a result, the electrical performance of the semiconductor structure may be improved. For instance, the reliability of the semiconductor structure may be improved and the RC delay effect may be reduced.

Second, during the formation of the trench by etching the dielectric layer, a portion of the first conductive layer is also removed by etching, therefore the process window for forming a second conductive layer may be increased while the filling outcome of the second conductive layer in the trench may be improved, thus the electric performance of the semiconductor structure may be further improved.

Moreover, the first conductive layer is made of carbon nanotubes, thus may have a number of advantageous properties such as high strength, ideal heat transfer property, and ideal electrical conductivity. In addition, diffusion of the ions in the first conductive layer into the dielectric layer is highly unlikely. Therefore, the barrier layer formed between the first conductive layer and the dielectric layer in the current technology may not be required, thus the resistivity of the semiconductor structure may be reduced, leading to further decrease of the RC delay effect of the semiconductor structure.

Further, during etching the via, the mask layer may also be etched. Therefore, damage to the dielectric layer due to an extra process to remove the mask layer may be avoided, thus the electrical performance of the semiconductor structure may be further improved.

Finally, the patterned layer includes a first hard mask layer formed on the surface of the passivation layer and a second mask layer formed on the surface of the first hard layer. The first hard mask layer may be formed of TaN while the second hard mask layer may be formed of TiN, therefore the process to form the trench by etching the dielectric layer may have a relatively high etching ratio to perform selective etching so that the morphology and the dimension of the trench to be formed may be easily controlled.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate with a dielectric layer formed on the substrate and a passivation layer formed on the dielectric layer;
   forming a via running through the dielectric layer and exposing the substrate by etching the passivation layer and the dielectric layer;
   forming a first conductive layer to fill the via with a top surface of the first conductive layer leveled with a top surface of the passivation layer;
   forming a patterned layer with an opening on the passivation layer, wherein the opening is located above the first conductive layer and a dimension of the opening is larger than a dimension of the via;
   forming a trench in the dielectric layer by etching a portion of the dielectric layer along the opening using the patterned layer as a mask;
   forming a second conductive layer filling the trench and electrically connected to the first conductive layer; and removing a portion of the second conductive layer exceeding a height of the dielectric layer, the patterned layer, and the passivation layer to make a top surface of the second conductive layer level with a top surface of the dielectric layer.

2. The method according to claim 1, wherein forming a via running through the dielectric layer further includes:
   forming a mask layer with a trench on the passivation layer;
   forming the via by etching the passivation layer and the dielectric layer along the trench using the mask layer as a mask; and
   removing the mask layer by etching.

3. The method according to claim 2, wherein the mask layer is removed simultaneously when the passivation layer and the dielectric layer are etched to form the via.

4. The method according to claim 2, wherein the mask layer includes a first photo-resist layer with a trench formed in the first photo-resist layer.

5. The method according to claim 4, wherein the mask layer further includes a first bottom anti-reflective coating formed on the surface of the passivation layer and covered by first photo-resist layer.

6. The method according to claim 2, wherein the mask layer is made of one or more of SiN, SiON, TiN, and TaN.

7. The method according to claim 1, wherein forming the first conductive layer to fill the via further includes:
   forming a first conductive film to fill up the via and to cover the top surface of the passivation layer; and
   forming a first conductive layer filling up the via and leveled with the passivation layer by removing the first conductive film formed on the surface of the passivation layer.

8. The method according to claim 1, wherein the first conductive layer is made of carbon nanotubes.

9. The method according to claim 8, wherein, prior to forming the first conductive layer, a metallic catalyst layer is formed on the bottom of the via.

10. The method according to claim 1, wherein the patterned layer is a hard mask layer and the opening in the patterned layer exposes the first conductive layer and a portion of the passivation layer.

11. The method according to claim 10, wherein the patterned layer is made of one or more of SiN, SiON, TiN, and TaN.

12. The method according to claim 11, wherein the patterned layer further includes:
   a first hard mask layer formed on the passivation layer; and
   a second hard mask layer formed on the first hard mask layer, wherein:
      the first hard mask layer is made of TaN; and
      the second hard mask layer is made of TiN.

13. The method according to claim 10, wherein forming the patterned layer further includes:
   forming an initial patterned layer to cover the passivation layer and the first conductive layer;
   forming a second photo-resist layer on the initial patterned layer; and
   forming a patterned layer with an opening by etching the initial patterned layer using the second photo-resist layer as a mask.

14. The method according to claim 13, prior to forming the second photo-resist layer, further including forming a second bottom anti-reflective coating to cover the passivation layer and the first conductive layer.

15. The method according to claim 1, wherein:
   when forming the trench by etching the dielectric layer, a portion of the first conductive layer is also removed; and
   the second conductive layer covers the etched first conductive layer.

16. The method according to claim 1, wherein the second conductive layer further includes:
   a barrier layer formed on a sidewall surface of the trench; and
   a metallic layer formed on the barrier layer.

17. The method according to claim 16, wherein:
   the barrier layer is made of Ti, Ta, W, TiN, TaN, TiSiN, TaSiN, WN, or WC; and
   the metallic layer is made of Cu.

18. The method according to claim 1, wherein the dielectric layer is made of a low-k dielectric material or an ultralow-k material.

19. A method according to claim 1, wherein the passivation layer is made of SiO or carbon-containing SiO.

20. A semiconductor structure, comprising:
   a substrate;
   a dielectric layer formed on a surface of the substrate;
   a first conductive layer formed in the dielectric layer; and
   a second conductive layer on a top of the first conductive layer and in the dielectric layer, wherein:
      the second conductive layer and the first conductive layer together provide a T-shaped cross section;
      the first conductive layer is in contact with the substrate; and
      a top surface of the second conductive layer is leveled with a top surface of the dielectric layer.

* * * * *